(12) United States Patent
Miller et al.

(10) Patent No.: US 9,818,584 B2
(45) Date of Patent: Nov. 14, 2017

(54) INTERNAL SPLIT FARADAY SHIELD FOR A PLASMA SOURCE

(71) Applicant: FEI Company, Hillsboro, OR (US)

(72) Inventors: Thomas G. Miller, Portland, OR (US); Shouyin Zhang, Portland, OR (US)

(73) Assignee: FEI Company, Hillsboro, OR (US)

( * ) Notice: Subject to any disclaimer, the term of this patent is extended or adjusted under 35 U.S.C. 154(b) by 194 days.

(21) Appl. No.: 14/325,146

(22) Filed: Jul. 7, 2014

(65) Prior Publication Data

US 2015/0008213 A1 Jan. 8, 2015

Related U.S. Application Data

(62) Division of application No. 13/277,072, filed on Oct. 19, 2011, now abandoned.

(51) Int. Cl.
| | |
|---|---|
| *B44C 1/22* | (2006.01) |
| *C03C 15/00* | (2006.01) |
| *C03C 25/38* | (2006.01) |
| *C23F 1/00* | (2006.01) |
| *H01J 37/32* | (2006.01) |
| *H01J 37/08* | (2006.01) |

(52) U.S. Cl.
CPC ........ *H01J 37/32651* (2013.01); *H01J 37/08* (2013.01); *H01J 37/321* (2013.01); *H01J 37/32504* (2013.01); *H01J 2237/0206* (2013.01); *H01J 2237/026* (2013.01); *H01J 2237/31749* (2013.01)

(58) Field of Classification Search
USPC ........................................................ 216/67
See application file for complete search history.

(56) References Cited

U.S. PATENT DOCUMENTS

| | | | |
|---|---|---|---|
| 4,362,632 | A | 12/1982 | Jacob |
| 4,503,329 | A | 3/1985 | Yamaguchi et al. |
| 4,659,899 | A | 4/1987 | Welkie et al. |
| 4,676,194 | A | 6/1987 | Satou et al. |
| 4,805,555 | A | 2/1989 | Itoh |
| 4,856,457 | A | 8/1989 | Knauer |

(Continued)

FOREIGN PATENT DOCUMENTS

| | | |
|---|---|---|
| JP | 64014849 | 1/1989 |
| JP | 3272549 B2 | 12/1991 |

(Continued)

OTHER PUBLICATIONS

Mao, D., et al., "Ionized physical vapor deposition of titanium nitride: Plasma and film characterization," Journal of Vacuum Science Technology A, 2002, pp. 379-387, vol. 20, No. 2.

(Continued)

*Primary Examiner* — Roberts Culbert
(74) *Attorney, Agent, or Firm* — Scheinberg & Associates, P.C.; Michael O. Scheinberg; John B. Kelly

(57) ABSTRACT

An inductively coupled plasma source for a focused charged particle beam system includes a conductive shield within the plasma chamber in order to reduce capacitative coupling to the plasma. The internal conductive shield is maintained at substantially the same potential as the plasma source by a biasing electrode or by the plasma. The internal shield allows for a wider variety of cooling methods on the exterior of the plasma chamber.

17 Claims, 5 Drawing Sheets

(56) References Cited

U.S. PATENT DOCUMENTS

| | | |
|---|---|---|
| 4,859,908 A | 8/1989 | Yoshida et al. |
| 4,870,284 A | 9/1989 | Hashimoto et al. |
| 4,886,969 A | 12/1989 | Knauer |
| 4,935,623 A | 6/1990 | Knauer |
| 5,008,537 A | 4/1991 | Toita et al. |
| 5,019,712 A | 5/1991 | Knauer |
| 5,036,252 A | 7/1991 | Lob |
| 5,108,535 A | 4/1992 | Ono et al. |
| 5,188,705 A | 2/1993 | Swanson et al. |
| 5,270,552 A | 12/1993 | Ohnishi et al. |
| 5,435,850 A | 7/1995 | Rasmussen |
| 5,573,595 A | 11/1996 | Dible |
| 5,614,711 A | 3/1997 | Li et al. |
| 5,647,945 A | 7/1997 | Matsuse et al. |
| 5,681,418 A | 10/1997 | Ishimaru |
| 5,686,796 A | 11/1997 | Boswell et al. |
| 5,825,035 A | 10/1998 | Mizumura et al. |
| 5,827,786 A | 10/1998 | Puretz |
| 5,850,083 A | 12/1998 | Koikari et al. |
| 5,851,413 A | 12/1998 | Casella et al. |
| 5,945,677 A | 8/1999 | Leung et al. |
| 6,017,221 A | 1/2000 | Flamm |
| 6,127,275 A | 10/2000 | Flamm |
| 6,228,176 B1 | 5/2001 | Chu et al. |
| 6,239,404 B1 | 5/2001 | Lea et al. |
| 6,280,563 B1 | 8/2001 | Baldwin, Jr. et al. |
| 6,385,977 B1 | 5/2002 | Johnson |
| 6,425,953 B1 | 7/2002 | Johnson |
| 6,447,636 B1 | 9/2002 | Qian et al. |
| 6,459,066 B1 | 10/2002 | Khater et al. |
| 6,491,742 B1 | 12/2002 | Johnson |
| 6,545,420 B1 | 4/2003 | Collins et al. |
| 6,554,953 B2 | 4/2003 | Daviet |
| 6,639,226 B2 | 10/2003 | Morio et al. |
| 6,743,481 B2 | 6/2004 | Hoehn et al. |
| 6,753,538 B2 | 6/2004 | Musil et al. |
| 6,758,948 B2 | 7/2004 | Johnson |
| 6,768,120 B2 | 7/2004 | Leung et al. |
| 6,770,836 B2 | 8/2004 | Kwon et al. |
| 6,806,650 B2 | 10/2004 | Johnson et al. |
| 6,833,051 B2 | 12/2004 | Kazumi et al. |
| 6,897,157 B2 | 5/2005 | Liang et al. |
| 6,926,935 B2 | 8/2005 | Arjavac et al. |
| 6,975,072 B2 | 12/2005 | Leung et al. |
| 7,084,407 B2 | 8/2006 | Ji et al. |
| 7,176,469 B2 | 2/2007 | Leung et al. |
| 7,220,963 B2 | 5/2007 | Gross |
| 7,241,361 B2 | 7/2007 | Keller et al. |
| 7,298,091 B2 | 11/2007 | Pickard et al. |
| 7,442,942 B2 | 10/2008 | Takahashi et al. |
| 7,629,590 B2 | 12/2009 | Horsky et al. |
| 7,670,455 B2 | 3/2010 | Keller et al. |
| 7,691,243 B2 | 4/2010 | Vukovic |
| 2001/0009353 A1 | 7/2001 | Patterson et al. |
| 2001/0022158 A1 | 9/2001 | Brcka |
| 2002/0023899 A1 | 2/2002 | Khater et al. |
| 2002/0175869 A1 | 11/2002 | Wilcoxson et al. |
| 2003/0024900 A1 | 2/2003 | Johnson |
| 2003/0062840 A1 | 4/2003 | Moroz |
| 2003/0168588 A1 | 9/2003 | Brailove et al. |
| 2004/0036032 A1 | 2/2004 | Leung et al. |
| 2004/0104683 A1 | 6/2004 | Leung et al. |
| 2004/0140054 A1 | 7/2004 | Johnson |
| 2004/0262237 A1 | 12/2004 | Kornbrekke et al. |
| 2005/0103623 A1 | 5/2005 | Tolmachev et al. |
| 2005/0183667 A1 | 8/2005 | Keller et al. |
| 2006/0045987 A1 | 3/2006 | Chandler et al. |
| 2006/0060566 A1 | 3/2006 | Puech |
| 2006/0272775 A1 | 12/2006 | Horsky et al. |
| 2007/0034154 A1 | 2/2007 | Fink |
| 2007/0108395 A1 | 5/2007 | Horsky et al. |
| 2007/0181257 A1* | 8/2007 | Comendant ....... H01J 37/32633 156/345.48 |
| 2007/0278417 A1 | 12/2007 | Horsky et al. |
| 2008/0067430 A1 | 3/2008 | Hershkowitz et al. |
| 2008/0080659 A1 | 4/2008 | Leung et al. |
| 2008/0142735 A1 | 6/2008 | Chandler et al. |
| 2008/0220596 A1 | 9/2008 | Olander et al. |
| 2008/0314871 A1 | 12/2008 | Toth et al. |
| 2009/0008239 A1 | 1/2009 | Sorensen et al. |
| 2009/0266984 A1 | 10/2009 | Hirano |
| 2009/0309018 A1 | 12/2009 | Smith et al. |
| 2010/0044580 A1 | 2/2010 | Boswell et al. |
| 2010/0126964 A1 | 5/2010 | Smith et al. |
| 2010/0243889 A1 | 9/2010 | Faber et al. |
| 2010/0301211 A1 | 12/2010 | Miller |
| 2011/0044418 A1 | 2/2011 | Stubbers et al. |
| 2011/0049382 A1 | 3/2011 | Miller et al. |
| 2011/0084207 A1 | 4/2011 | Zhang et al. |
| 2011/0091000 A1 | 4/2011 | Stubbers et al. |
| 2011/0163068 A1 | 7/2011 | Utlaut et al. |
| 2012/0280136 A1 | 11/2012 | Zhang et al. |

FOREIGN PATENT DOCUMENTS

| | | |
|---|---|---|
| JP | 6176725 | 6/1994 |
| JP | 7312201 | 11/1995 |
| JP | 7335163 | 12/1995 |
| JP | 2004-537830 | 12/2004 |
| JP | 2008-128887 | 6/2008 |
| JP | 2009140762 A | 6/2009 |
| JP | 2010225411 A | 10/2010 |
| JP | 2011-142081 | 7/2011 |
| WO | WO2005038821 A2 | 4/2005 |
| WO | WO2007149727 A2 | 12/2007 |
| WO | WO2008094297 A2 | 8/2008 |
| WO | WO2009148648 A1 | 12/2009 |

OTHER PUBLICATIONS

Dickson, M., et al., "Radial uniformity of an external-coil ionized physical vapor deposition source," J. Vac. Sci. Technol. B, Mar./Apr. 1998, pp. 523-531, vol. 16, No. 2.

Johnson, Wayne L., "Electrostatically-Shielded Inductively-Coupled RF Plasma Sources," High Density Plasma Sources: Design and Physics and Performance, Popov, Oleg, A., Ed., 1995, pp. 100-148.

"CeramTec High Voltage Isolator Catalog," CeramTec North America Corporation, accessed Feb. 29, 2008, pp. OP1019-OP1033.

Hahto, S.K., et al., "Multicusp ion source with external rf antenna for production of protons," Review of Scientific Instruments, Feb. 2004, pp. 355-359, vol. 75, No. 2.

Hayes, A.V., et al., "Recent advances in Veeco's radio frequency ion sources for ion beam materials processing applications (abstract)," Review of Scientific Instruments, Feb. 2002, p. 880, vol. 73, No. 2.

"IMG-31 / IGPS-31 Microwave Ion Source / Power Supply," Kimball Physics Inc., accessed Apr. 4, 2011, pp. 2-9-2-10.

Iwai, H., et al., "A Study of Charge Compensation for Insulator Samples in AES by Low Energy Ion Beam Irradiation,"Journal of Surface Analysis, 1999, 4 pages, vol. 5, No. 1.

Jiang, X., et al., "Mini rf-driven ion sources for focused ion beam systems," Review of Scientific Instruments, Apr. 2003, pp. 2288-2292, vol. 74, No. 4.

Ji, Qing, et al., "Development of focused ion beam systems with various ion species," Nuclear Instruments and Methods in Physics Research B: Beam Interactions with Materials & Atoms, 2005, pp. 335-340, vol. 241.

Leung, K., "Radio-Frequency Driven Sources," The Physics and Technology of Ion Sources, 2nd Edition, Ian G. Brown (Ed.), Nov. 2004, pp. 163-175, Wiley-VCH, Weinheim, Germany.

Mordyk, Serhiy, et al., "High-plasma-density helicon source for ion beam application," 13th International Congress on Plasma Physics, May 22-26, 2006, pp. OP1181-OP1184, Kiev, Ukraine.

Mukherjee, S.K., et al., "Mechanical Design of the Prototype H Ion Source for the Spallation Neutron Source," Proceedings of the 1999 Particle Accelerator Conference, New York, 1999, pp. 1914-1916.

Nabhiraj, P.Y., et al., "Design of High Current RF Ion Source for Micromachining Applications," APAC 2007, Raja Ramanna Centre for Advanced Technology (RRCAT), Indore, India, pp. 262-264.

(56) References Cited

OTHER PUBLICATIONS

Okada, Katsuyuki, et al., "Diagnostics of Low Pressure Inductively Coupled VHF Plasma Used for Nanostructured Carbon Deposition," 28th International Conference of Phenomena in Ionized Gases, Jul. 15-20, 2007, Prague, Czech Republic, pp. OP1210-OP1211.
"Plasma Controller, Oxford Scientific 'OSPreyRF'," Oxford Scientific Instruments for Innovators, accessed Apr. 4, 2011, p. OP1212.
Panagopoulos, Theodoros, et al., "Plasma sheath model and ion energy distribution for all radio frequencies," Journal of Applied Physics, Apr. 1, 1999, pp. 3435-3443, vol. 85, No. 7.
Welton, R.F., et al., "RF-Plasma Coupling Schemes for the SNS Ion Source," Radio Frequency Power in Plasmas: 15th Topical Conference on Radio Frequency Power in Plasmas. AIP Conference Proceedings, 2003, pp. 431-438, vol. 694.
Welton, R.F., et al., "The design of high power, external antennas for radio frequency multicusp ion sources," Review of Scientific Instruments, May 2004, pp. 1789-1792, vol. 75, No. 5.
"RFVII Brochure," RFVII Incorporated, accessed Feb. 29, 2008, pp. OP0996-OP1005.
Speth, E., et al., "Overview of RF Source Development at IPP," CCNB-Meeting at Padua, Italy, Jun. 5-6, 2003, pp. 1-29.
Sobolewski, Mark, et al., "Ion energy distributions and sheath voltages in a radio-frequency-biased, inductively coupled, high-density plasma reactor," Journal of Applied Physics, Apr. 15, 1999, pp. 3966-3975, vol. 85, No. 8.
Sobolewski, Mark, et al., "Measurements and modeling of ion energy distributions in high-density, radiofrequency biased CF4 discharges," Journal of Applied Physics, May 15, 2002, pp. 6303-6314, vol. 91, No. 10.
Wagenaars, Erik, "Plasma Breakdown of Low-Pressure Gas Discharges," Nov. 30, 2006, pp. 6-7, Eindhoven University of Technology, Eindhoven, Netherlands.
Wang, Yicheng, et al., "Ion energy distributions in inductively coupled radio-frequency discharges in argon, nitrogen, oxygen, chlorine, and their mixtures," Journal of Applied Physics, May 1, 1999, pp. 6358-6365, vol. 85, No. 9.
Welton, R.F. et al., "Development and Status of the SNS Ion Source," Proceedings of the 2003 Particle Accelerator Conference, 2003, pp. 3306-3308.
Welton, Robert, et al., "Ion Source R&D at the SNS," Accelerator Physics and Technology Seminar, Fermilab, Jan. 19, 2006, pp. OP1283-OP1314.
"Xe Sputter Yields, Group 1, Li to S, O" National Physical Laboratory, May 12, 2005, pp. OP1034-OP1039.
Coath, C.D., et al., "A high-brightness duoplasmatron ion source for microprobe secondary-ion mass spectrometry," Rev. Sci. Instrum., Feb. 1995, pp. 1018-1023, vol. 66, No. 2.
Coupland, J.R., et al., "A Study of the Ion Beam Intensity and Divergence Obtained from a Single Aperture Three Electrode Extraction System," Rev. Sci. Instrum., Sep. 1973, pp. 1258-1270, vol. 44, No. 9.
Daykin, P.N., "Electrode shapes for a cylindrical electron beam," British Journal of Applied Physics, Jul. 1955, vol. 6, pp. 248-250.
Harrison, E.R., "Approximate electrode shapes for a cylindrical electron beam," British Journal of Applied Physics, Jan. 1954, vol. 5, pp. 40-41.

Han, B.X., et al., "Evaluation and utilization of beam simulation codes for the SNS ion source and low energy beam transport development," Review of Scientific Instruments, Feb. 4, 2008, pp. 02B904-1-02B904-5, vol. 79, No. 2.
Henderson, S., et al., "Status of the SNS Beam Power Upgrade Project," Proceedings of EPAC 2006, 2006, pp. 345-347, Edinburgh, Scotland.
Hopwood, J., "A Microfabricated Inductively-Coupled Plasma Generator," Journal of Microelectromechanical Systems, Sep. 2000, pp. 309-313, vol. 9, Issue 3.
Johnson, Wayne L., "Electrostatically-Shielded Inductively-Coupled RF Plasma Sources," High Density Plasma Sources: Design, Physics and Performance, Jan. 14, 1997, ISBN-10: 0815513771, Chapter 3.
Keller, R., "Ion Extraction," The Physics and Technology of Ion Sources, The University of California, Berkeley, 1989, pp. 23-50.
Leung, Ka-Ngo, "Plasma sources for electrons and Ion beams," J. Vac. Sci. Technol. B, Nov./Dec. 1999, pp. 2776-2778, vol. 17, Issue 6.
Lieberman, Michael A., et al., "Principles of Plasma Discharges and Materials Processing," 1994, ISBN: 0-471-00577-0, pp. 31-37 and 157-163.
Mathew, Jose V., et al., "Subcutoff microwave driven plasma ion sources for multielemental focused ion beam systems," Review of Scientific Instruments, 2008, pp. 063504-1-063504-5, vol. 79, No. 6.
Smith, N. S., et al., "A High Brightness Source for Nano-Probe Secondary Ion Mass Spectrometry," Applied Surface Science, Dec. 15, 2008, pp. 1606-1609, vol. 255, Issue 4.
Smith, N. S., et al., "High brightness inductively coupled plasma source for high current focused ion beam applications," J. Vac. Sci. Technol. B, Nov./Dec. 2006, pp. 2902-2906, vol. 24, No. 6.
Steffens, P., et al., "A time-of-flight mass spectrometer for static SIMS applications," J. Vac. Sci. Technol. A, May/Jun. 1985, pp. 1322-1325, vol. 3, Issue 3.
Tesch, Paul, et al., "High Current Focused Ion Beam Instrument for Destructive Physical Analysis Applications," 34th International Symposium for Testing and Failure Analysis, Nov. 2-6, 2008, pp. 7-13, Portland, Oregon.
Vargas-Aburto, Carlos, et al., "Development of a Quadrupole-Based Secondary-Ion Mass Spectrometry (SIMS) System at Lewis Research Center," Jun. 1990, 36 pages.
Welton, R.F., et al., "Advanced RF-Driven H-Ion Sources At the SNS," Particle Accelerator Conference, Jun. 25-29, 2007, pp. 3774-3776.
Welton, R.F., et al., "Ion source antenna development for the Spallation Neutron Source," Review of Scientific Instruments, Feb. 2002, pp. 1008-1012, vol. 73, No. 2.
Yin, Y., et al., "Miniaturization of Inductively Coupled Plasma Sources," Plasma Science, IEEE Transactions, Oct. 1999, pp. 1516-1524, vol. 27, Issue 5.
Welton, R.F., et al., "The continued development of the Spallation Neutron Source external antenna H-ion source," Review of Scientific Instruments, 2010, pp. 02A727-1-02A727-3, vol. 81.
Whitlock, Bill, "Shields, grounds and microphone cables," 2004 Rycote Microphone Windshields Ltd., pp. 1-6.
Wituschek, H., et al., "Investigation of extraction systems with low aberrations," Rev. Sci. Instrum., Apr. 1992, pp. 2785-2787, vol. 63, No. 4.

\* cited by examiner

INTERNAL SPLIT FARADAY SHIELD FOR A PLASMA SOURCE

This application is a Divisional of U.S. patent application Ser. No. 13/277,072, filed Oct. 19, 2011, which is hereby incorporated by reference.

TECHNICAL FIELD OF THE INVENTION

The present invention relates to inductively-coupled plasma ion sources for focused beam systems.

BACKGROUND OF THE INVENTION

Plasma ion technology is commonly used for semiconductor wafer processing. Ion sources designed to process an entire semiconductor wafer are required to provide a uniform beam of ions over a broad area, such as over a 300 mm wafer. One application of such plasma systems would be to remove photoresist. The plasma produces a reactive species, such as monatomic fluorine or oxygen, that reacts with the photoresist to turn it to ash, which is subsequently removed by the vacuum pump. Because the ashing is performed by a reactive species, rather than by sputtering, the energy of the ions impacting the work piece can be relatively low and the voltage difference between the interior of the plasma chamber and the work piece is generally low.

The requirements for plasma sources used in focused beam systems, such as a scanning electron microscope or a focused ion beam system, are significantly different requirements from those used in whole wafer processing systems. Ion or electron beams are focused to sub-micron spots. Because the focusing system typically projects a demagnified image of the virtual ion source onto the sample, the virtual ion source from which the charged particles are emitted should be small to produce a small spot on the sample. That is, the ion source should provide a relatively large number of ions coming from a small area. The energies of all the charged particles in the beam must be similar, or chromatic aberration will prevent the charged particles from focusing to a fine point.

Inductively coupled (IC) plasma sources have advantages over other types of plasma sources when used with a focusing column to form a focused beam of charged particles, i.e., ions or electrons. The inductively coupled plasma source is capable of providing charged particles within a narrow energy range, which allows the particles to be focused to a small spot. IC plasma sources, such as the one described in U.S. Pat. No. 7,241,361, to Keller et al. for a "Magnetically Enhanced, Inductively Coupled Plasma Source for a Focused Ion Beam System," which is assigned to the assignee of the present invention and is here by incorporated by reference, include a radio frequency (RF) antenna typically wrapped around a ceramic plasma chamber. The RF antenna provides energy to maintain the gas in an ionized state within the chamber.

Focused charged particle beam systems are often used to etch or deposit material or to form an image of a work piece and the charged particles are accelerated to relatively high energies by a voltage difference between the source and the work piece. Ions in a focused ion beam typically impact the work piece with landing energies of between 5 keV and 100 keV, more typically at about 30 keV. Electron landing energies vary between about 500 eV to 5 keV for a scanning electron microscope system to several hundred thousand electron volts for a transmission electron microscope system. To reduce risk to personnel, the work piece is typically maintained at or near ground potential, and the plasma source is maintained at a high voltage, either positive or negative, depending on the particles used to form the beam. "High voltage" as used herein means positive or negative voltage greater than about 500 V above or below ground potential. For the safety of operating personnel, it is necessary to electrically isolate the high voltage components. The electrical isolation of the high voltage plasma creates several design problems that are difficult to solve in light of other goals for a plasma source design.

For example, it is desirable to place the radio frequency coils that provide power to the plasma as close as possible to the plasma to efficiently transfer power, but having a difference in voltage across a small distance leads to arcing, which can damage the system. As described above, the plasma is maintained at a high DC voltage, while the radio frequency coils are typically oscillated at an RF voltage that is high, but lower than the DC voltage of the plasma. One way to eliminate much of the voltage difference between the plasma and the coil would be to maintaining the coils at a DC bias equal to the high potential as the plasma. This solution, however, would require maintaining the power supply for the coil at the high plasma potential, which would excessively complicate the power supply design and greatly increase the cost.

FIG. 1 shows schematically a typical prior art plasma source 100 for use in a focused ion beam system. The plasma source 100 includes a plasma chamber 102. Plasma 104 is maintained within the plasma chamber 102. A plasma extraction and biasing electrode 106 encloses the bottom portion of plasma chamber 102. Electrode 106 has an exterior high voltage connection to a bias voltage source 107 that is used to bias the plasma to its target potential, typically to 30 kV for most charged particle beam applications. Electrons or ions are directed from the plasma source through opening 112 to a work piece. A split Faraday shield 108 is placed between plasma chamber 102 and RF coils 110. Shield 108 is typically well grounded, and cooling fluids can be delivered in the space between plasma chamber 102 and RF coils 110. For the purpose of forming small probes with minimal chromatic aberrations, a Faraday shield can help prevent RF induced energy spread. Faraday shield for plasma ion sources are described, for example, in Johnson, Wayne L., "Electrostatically-Shielded Inductively-Coupled RF Plasma Sources," HIGH DENSITY PLASMA SOURCES: DESIGN AND PHYSICS AND PERFORMANCE, Popov, Oleg, A., Ed. (1995).

The grounded Faraday shield isolates the high DC voltage plasma from the radio frequency coil potential and reduces capacitive coupling between the coil and the plasma. When the Faraday shield is located close to the dielectric plasma container, the large electric field caused by the voltage difference between the grounded shield and the plasma being biased to the necessary accelerating voltage (e.g. 30 kV) causes the possibility of a high voltage discharge which could damage the source. The presence of air trapped between the Faraday shield and the ceramic also causes the potential for arcing in that region.

The introduction of the Faraday shield between the plasma chamber and the antenna also inevitably leads to the antenna being placed further away from the plasma vessel, which can cause complications including arcing from the antenna to the shield and from the shield to the plasma. Furthermore, Faraday shields may have sharp edges which cause additional high voltage management concerns.

Not only is high voltage management a design challenge for a plasma source for a focused ion beam system, heat management is also a challenge. The energy applied to the plasma chamber generates heat in the plasma chamber and in the radio frequency coils. While a compact plasma source is desirable for beam formation, the more compact and powerful the plasma source, the hotter the source becomes and therefore the greater the need to efficiently dissipate the heat. The high voltage can also make cooling difficult, which can limit the density of the plasma used. These conflicting requirements make the design of an ICP source very challenging. U.S. patent application Ser. No. 13/182,925, which is assigned to the assignee of the present invention, describes a liquid cooled plasma source for a focused charged particle beam system.

The Faraday shield can complicate the cooling methods. Fluids in contact with the shield must not erode or oxidize the shield, and the choice of cooling fluid may also be limited by the dielectric concerns associated with the high voltage management at the sharp edges of the Faraday shield.

M. Dickson, et al., "Radial Uniformity of an External-Coil Ionized Physical Vapor Deposition Source," J. Vac. Sci. Tech. B 16(2) (1998), describes a plasma system for ionized physical vapor deposition of metal onto wafers. The plasma ions bombard a metal target, and the metal sputtered from the target are ionized and directed toward the wafer below by the plasma sheath. Because the sputtered metal from the target will quickly form an electrical path around the inside of the quartz chamber, a water-cooled metal Faraday shield is used inside the plasma chamber. The Faraday shield within the plasma chamber acts as a baffle for sputtered metal and protects the dielectric walls of the plasma chamber from thick deposits of metal film. The water-cooling lines are electrically isolated from ground and connected through isolated radio frequency power feedthroughs. The large, wafer scale plasma chamber of M. Dickson, et al., facilitates the engineering of the Faraday shield within the large plasma chamber.

SUMMARY OF THE INVENTION

An object of the invention is to reduce capacitive coupling to the plasma in charged particle beam systems in order to have a desirably low energy spread for beam forming purposes.

This invention provides a Faraday shield within the plasma chamber of a focusing charged particle beam system, with the Faraday shield either biased to the plasma potential or a substantial fraction of it.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Designing a plasma source typically entails many tradeoffs to meet conflicting design requirements. Embodiments of the invention can provide excellent coupling between the RF coil and the plasma, efficient cooling of the plasma chamber, and excellent capacitive screening, all of which can help produce an inductively-coupled plasma that is dense, quiescent, and at a high potential.

The description below describes a plasma source for a focused ion beam system, but a plasma source of the present invention can be used for an electron beam system, or other system. For purposes of the present invention, the terms shield, Faraday shield, electrostatic shield, and capacitive shield are equivalent.

A preferred embodiment uses a Faraday shield that is internal to the plasma chamber, that is, a Faraday shield within the walls of the plasma chamber. Prior art plasma sources for focused beam systems have not used an internal split Faraday shield because the design difficulties, such as excessive heating and were known, while the extent of the advantages of an internal shield for a system with probe-forming optics was not appreciated. Applicants have found several advantages to having an internal Faraday shield. Eliminating the external Faraday shield, the radio frequency coils can be placed closer to the plasma tube, leading to higher coupling efficiency. Applicants also found that an internal Faraday shield allows for more flexibility in designing a cooling system because the space outside the plasma tube is clearer. Also, the erosion of the shield material caused by the interaction with the cooling fluid is avoided. Unlike the system of M. Dickson, et al., there is no metal target in the plasma chamber to function as a sputtering source and typically no metal ions in the plasma. The Faraday shield in most embodiments of the present invention is not liquid cooled. The plasma source of the present invention is used as a source of ions for a probe forming system, that is, the ions leave the plasma chamber and are formed into a beam that is focused onto a sample. Unlike the system of M. Dickson, et al., the work piece is not placed in the plasma chamber.

Figure 1:
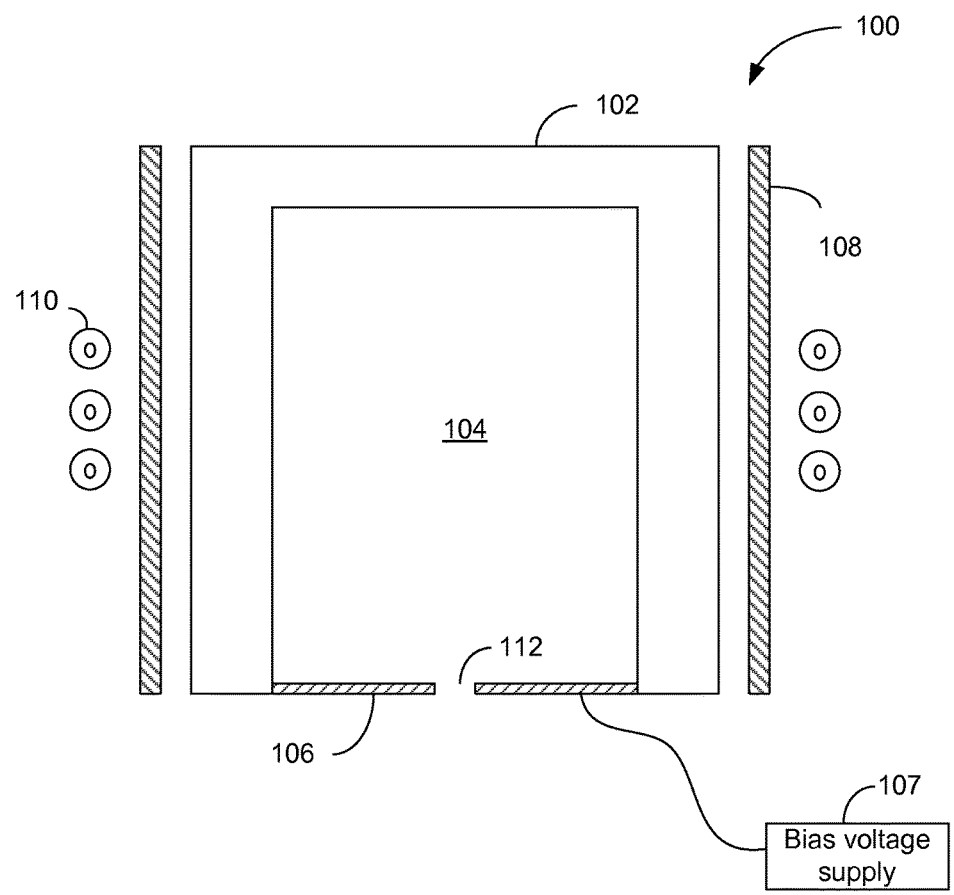
FIG. 1 shows a prior art plasma source that uses an external Faraday shield.
Figure 2:
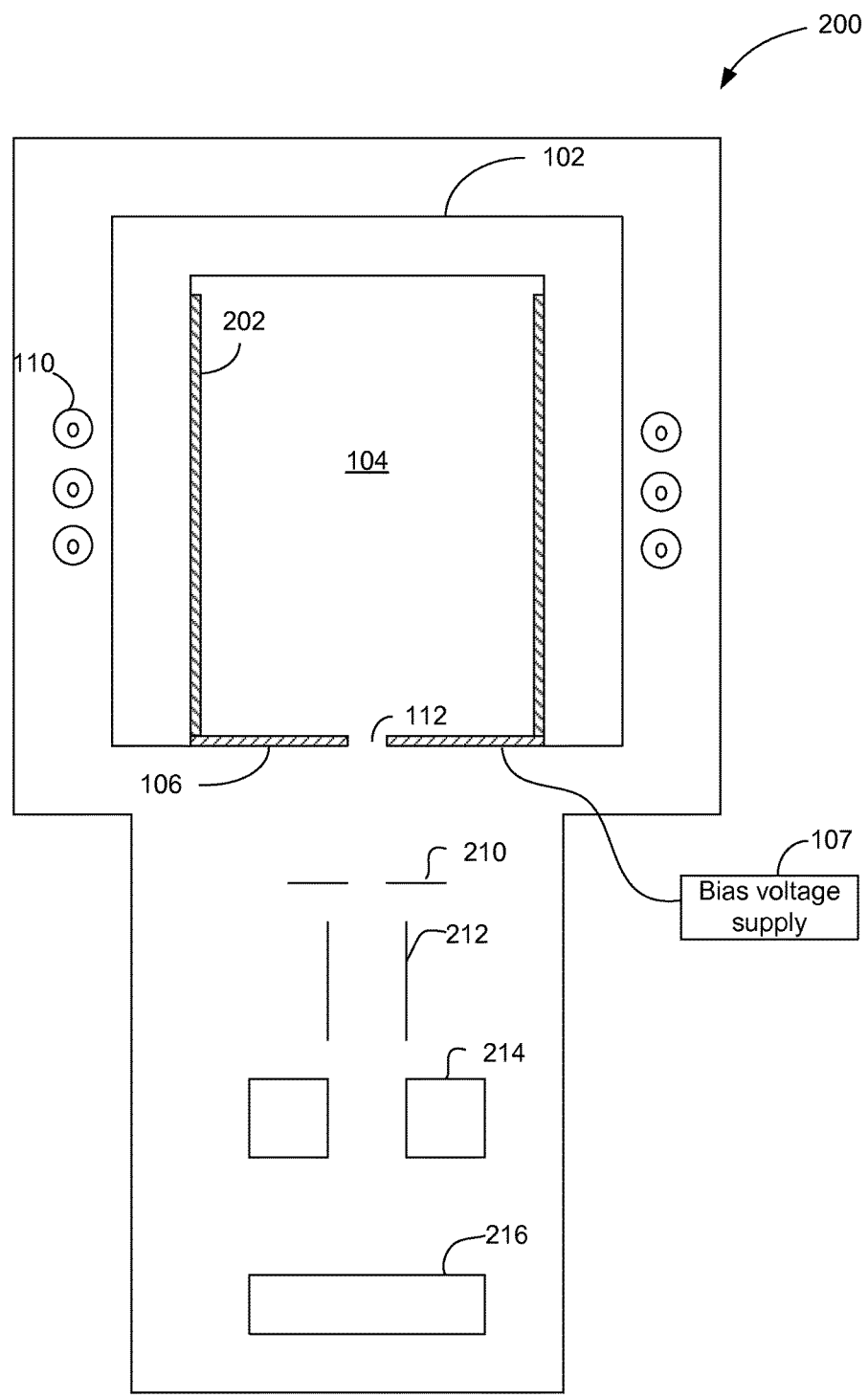
FIG. 2 shows an embodiment of the invention in which the Faraday shield is placed within the plasma chamber.

FIG. 2 shows a plasma source 200 of a charged particle beam system used in an embodiment of the present invention. A Faraday shield 202 is positioned within plasma chamber 102. Shield 202 is conductive and is placed in electrical contact with electrode 106 so that the Faraday shield, along with plasma 104, is biased by a bias voltage source 107 to a target potential, typically 30 kV, for charged particle beam processes. Alternatively, having an internal shield 202 allows RF coils 110 to be placed closer to the plasma chamber, leading to a higher coupling efficiency. To prevent sputtering, the Faraday shield is designed in such a manner that with the operational parameters of the plasma source, the energy spread of ions is kept less than 40 eV, more preferably less than 20 eV, and most preferably less than 6 eV. Maintaining this level of energy spread will also prevent sputtering of the plasma source aperture. Shield 202 can be comprised of any conductive material that is compatible with the environment inside of plasma chamber 102. For example, shield 202 may be composed of copper, silver-plated copper or other highly conductive metals. Shield 202 can be a metal layer plated or otherwise coated onto the interior wall of the plasma chamber 102, or it can be an insertable sleeve. A conductor outside the RF coils 110 forms a ground plane to isolate the high voltage plasma chamber and RF coils from the system operator. For adequate heat management, embodiments of the invention provide a method of distributing heat from the internal Faraday shield to the walls of plasma chamber 102 and/or the electrode 106.

In addition to the shielding effect, the internal Faraday shield also effectively extends the contact area of the bias potential along the axis of the plasma containment, and as such, provides better biasing of the plasma and leads to less possibility of bias voltage differences along the plasma chamber axis, resulting in a better energy spread. It is preferable to have a single electrical connection provide bias both to the Faraday shield and the extraction aperture.

The focusing column that focuses the charged particles extracted from the plasma source typically includes a beam defining aperture 210, deflectors 212, and at least one lens 214 for focusing the particles onto the sample 216.

Figure 3:
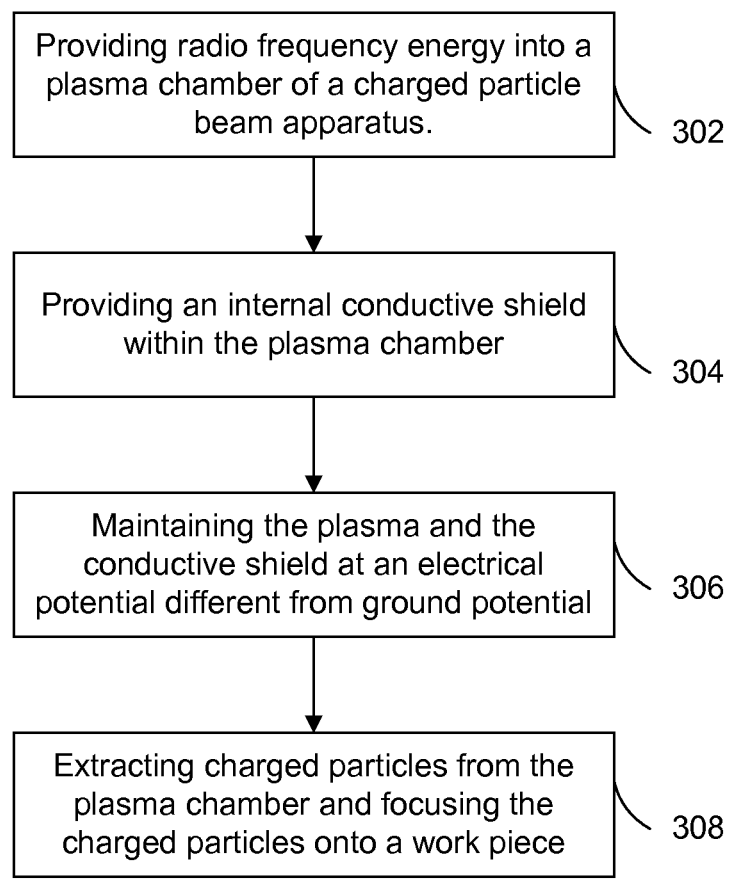
FIG. 3 shows the steps of using the embodiment in FIG. 2.

FIG. 3 shows the steps of using the embodiment in FIG. 2. Step 302 involves providing radio frequency energy into a plasma chamber in order to maintain the plasma. Step 304 involves providing an internal split Faraday shield within the plasma chamber to reduce capacitive coupling between the source of the radio frequency and the plasma. Step 306 involves maintaining the plasma and the Faraday shield at an electrical potential different from the ground potential, typically at a voltage greater than 100 V, greater than 1000 V or greater than 10,000 V. This is achieved by having the shield in contact with a biasing electrode. Alternatively, the Faraday shield could be "floating," that is, passively, not actively, biased but being in contact with the plasma and floating at near the plasma voltage. Skilled persons will understand that while the electrical potential at the plasma will be substantially the same as the electrical potential at the shield and the extractor, the voltages will not be exactly the same as the voltage within the plasma because of the voltage drop, typically less than 50 V, across the plasma sheath at the boundary of the plasma. Biasing the shield does not necessary mean that an electrode is in direct physical contact with the shield—the biasing can be indirect, such as through the extractor electrode or through the plasma.

Finally, step 308 involves extracting charged particles from the plasma chamber using extraction optics and focusing the charged particles onto a workpiece. A cooling fluid can also be provided in the exterior of the plasma chamber in order to cool the plasma chamber. Other cooling methods, such as the use of a non-circulating coolant or heat tubes, are described in U.S. patent application Ser. No. 13/165,556 of Kellogg, et al. for "Encapsulation of Electrode in Solid Media for use in Conjunction with Fluid High Voltage Isolation," which is assigned to the assignee of the present invention. The cooling methods described in U.S. patent application Ser. No. 13/165,556 can be used with the internal Faraday shield described herein.

Figure 4:
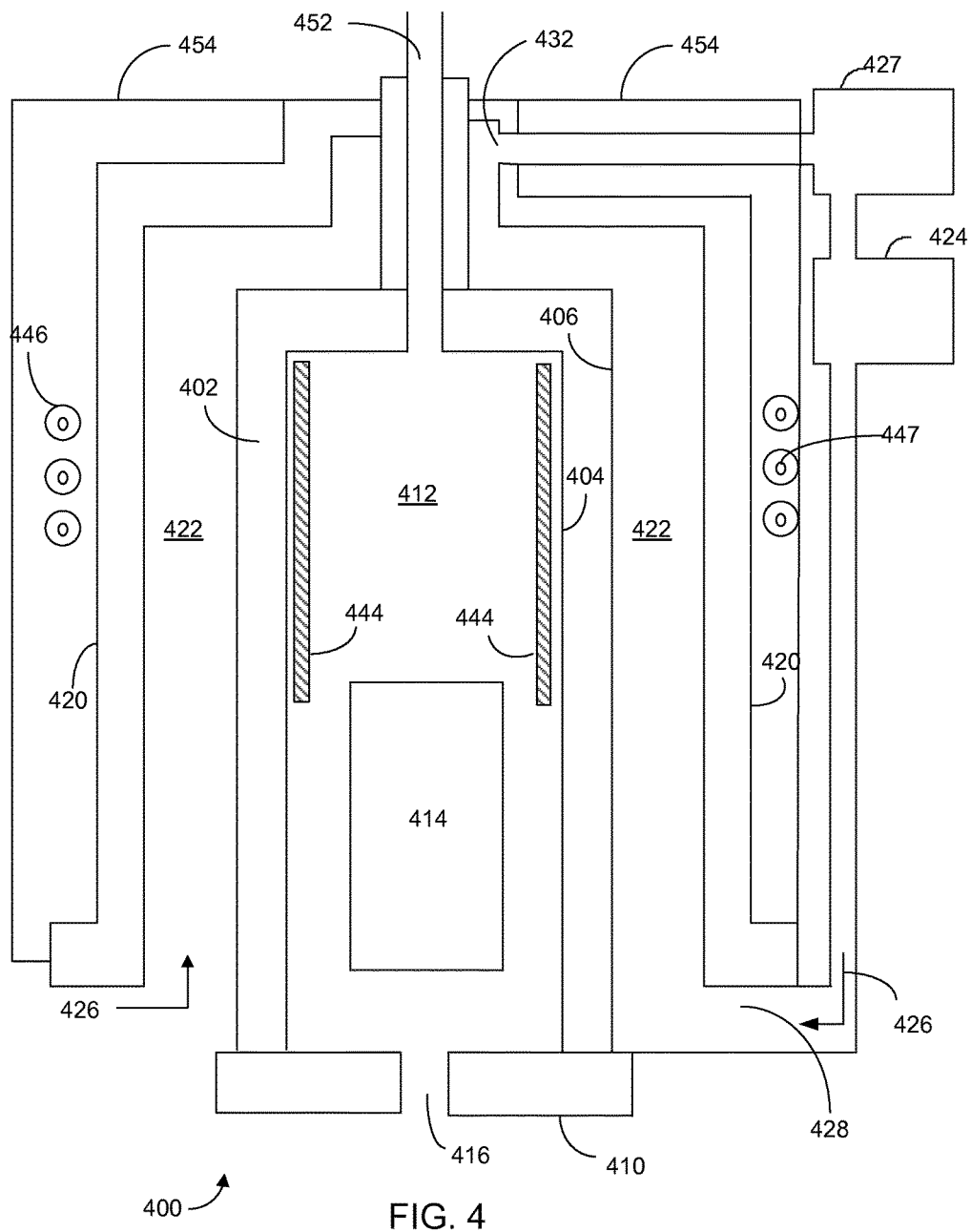
FIG. 4 shows a longitudinal cross-sectional schematic view of a plasma source that uses an internal Faraday shield for reduced coupling in conjunction with a fluid in the exterior of the plasma chamber for cooling.

FIG. 4 shows a longitudinal cross-sectional schematic view of a plasma source 400 that uses an internal Faraday shield for reduced coupling with a fluid in the exterior of the plasma chamber for cooling. The plasma source 400 includes a dielectric plasma chamber 402 having an interior wall 404 and an exterior wall 406. Plasma chamber 402 rests on a conductive base plate electrode 410. Plasma 412 is maintained within the plasma chamber 402. Extraction optics 414 extract charged particles, ion or electrons depending on the application, from plasma 412 through an opening 416 in base electrode 410. A dielectric outer shell 420, preferably of ceramic or plastic material that transmits radio frequency energy with minimal loss defines a space 422 between outer shell 420 and plasma chamber outer wall 406. A Faraday shield 444 is located within the plasma chamber 402 such that the Faraday shield is between the interior wall 404 and the plasma 412. A pump 424 pumps a cooling fluid 426 from a reservoir/chiller 427 to space 422 through cooling fluid inlets 428 and exit through exit 432, cooling plasma chamber 402 by thermal transfer from outer wall 406. Gas is provided to the plasma chamber 406 by inlet 452. A ground shield 454 shield the plasma chamber from the operator's environment.

A typical prior art Faraday shield is well grounded and located on the exterior of the plasma chamber, resulting in rapid electric potential drops between the plasma region and the shield. These rapid electric potential drops impose limitations on the materials inserted between the plasma region and the conductive Faraday shield. In the prior art, only materials with sufficiently large dielectric strength to prevent arcing can be inserted in this region. However, because the present invention has internal Faraday shield 444, which is biased to a target potential, essentially any type of material can be used within space 422 because there are no rapid potential drops and arcing is significantly reduced. Dielectric breakdown resulting from the cooling fluid can thus be prevented by having an internal shield, and a wide variety of cooling fluids, even those without adequate dielectric constants, can be used to cool plasma chamber 402. As used herein, a "fluid" can comprise a liquid or a gas.

Typically, the cooling method involves a liquid coolant which is chosen to be free of gaseous bubbles or other impurities which could present the opportunity for field enhancement and gaseous electric discharge. The cooling fluid should also have sufficient heat capacity to prevent the plasma chamber 402 from overheating without requiring a large fluid flow that requires a large pump that would consume excessive power. The plasma chamber outer wall 406 is typically maintained at a temperature of less than about 50° C.

The internal Faraday shield 444 passes the radio frequency energy from RF coils 446 to energize the plasma while reducing the capacitive coupling between radio frequency coils 446 and plasma 412. In some embodiments, the Faraday shield 444 is protected from physical damage by being substantially encapsulated in a solid dielectric media, such as ceramic, glass, resin, or polymer, to eliminate high voltage discharge. RF coils 446 may be hollow and cooled by flow of a fluid coolant through the internal passages 447 in the coils. Alternatively, coolant can flow over the exterior of the RF coils. The plasma chamber coolant system may also pump fluid coolant through the coils, or the coils can have an independent cooling system.

Figure 5:
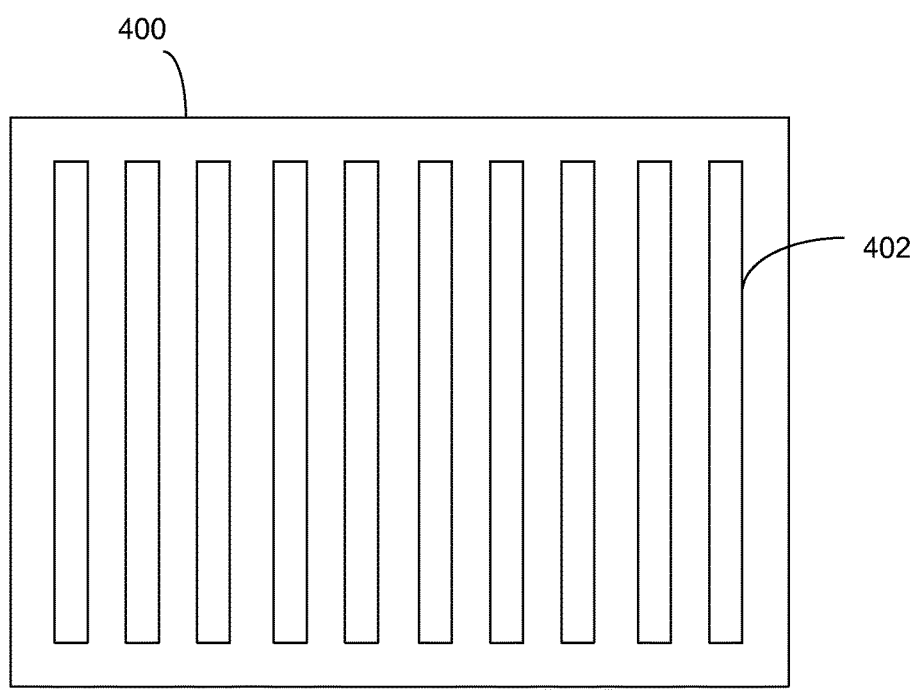
FIG. 5 shows a view of a flat, split Faraday shield.

In some embodiments of the invention, the shield is a split Faraday shield. The internal Faraday shield is wrapped around to form a cylindrical shape. FIG. 5 shows a view of a flat, split Faraday shield 500 that can be used in some embodiments of the present invention. Faraday shield 500 is "split" and has vertical slots 502. The vertical slots reduce induced currents that drain energy from the radio frequency coils and produce heat. Persons skilled in the art will readily appreciate that the width, length, and quantity of slots 502 can be altered in order to result in an appropriate level of capacitance coupling and modulation.

Some embodiments of the invention comprise:
a plasma source including:
a plasma chamber for containing a plasma;
a conductor for providing radio frequency energy into the plasma chamber; and
a conductive shield for reducing capacitative coupling between the conductor providing radio frequency energy and the plasma, wherein the conductive shield is placed within the plasma chamber; and
one or more focusing lenses for focusing charged particles from the plasma source onto a sample.

In some embodiments, the system includes a biasing electrode for electrically biasing the conductive shield to a desired voltage.

In some embodiments, the conductive shield comprises a layer coated onto the interior wall of the plasma chamber.

In some embodiments, the conductive shield comprises a thin conductive foil inserted within the plasma chamber.

In some embodiments, the charged particle beam system further comprising a cooling fluid surrounding and in thermal contact with at least a portion of the plasma chamber. In some embodiments, the cooling fluid comprises air or a liquid.

In some embodiments, the conductive shield is maintained at substantially the same voltage as the exterior boundary of the plasma sheath.

In some embodiments, the conductive shield is electrically isolated and during operation is maintained at substantially the same electrical potential as the external boundary of the plasma sheath.

In some embodiments, the conductive shield is maintained at a voltage having a magnitude of between 500V and 100 kV or between 5000V and 50000V.

In some embodiments, the plasma is biased to produce a landing energy of the charged particles of between 500 eV and 100 keV.

In some embodiments, the conductive shield and plasma are maintained at an electrical potential different from ground potential.

In some embodiments, the conductive shield is a split Faraday shield and in some embodiments, the split Faraday shield is wrapped around to form a cylindrical shape within the plasma chamber.

In some embodiments, plasma temperature is kept low enough to avoid sputtering of the conductive shield within the plasma chamber.

In some embodiments, the conductive shield distributes heat from the plasma to the walls of the plasma chamber.

In some embodiments, the conductor for providing radio frequency energy into the plasma chamber includes internal passages for passage of a cooling fluid.

Some embodiments of the invention include a method of operating an inductively coupled plasma source including a plasma chamber comprising:
providing radio frequency energy into the plasma chamber from at least one conductive coil to maintain a plasma in the plasma chamber;
providing a conductive shield to reduce capacitive coupling between the source of the radio frequency and the plasma;
maintaining the plasma and the conductive shield at an electrical potential different from ground potential;
extracting charged particles from the plasma chamber; and
focusing the charged particles into a beam and directing the beam onto or near a workpiece.

In some embodiments, the method further comprises providing a cooling fluid to cool the plasma chamber.

In some embodiments, providing a conductive shield includes providing a conductive shield coated onto the interior wall of the plasma chamber.

In some embodiments, providing a conductive shield includes providing a conductive material inserted into the interior of the plasma chamber.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. The terms "including" and "comprising" are used in the claims below an open-ended fashion, and thus should be interpreted to mean "including, but not limited to . . . ."

We claim as follows:

1. A method of operating a plasma source for a focused beam system, the plasma source including a plasma chamber comprising:
providing radio frequency energy into the plasma chamber from at least one conductive coil to maintain a plasma in the plasma chamber;
providing a conductive shield positioned within the plasma chamber such that no portion of the conductive shield extends into a second chamber containing a workpiece to reduce capacitive coupling between the source of the radio frequency and the plasma;
maintaining the plasma and the conductive shield at electrical potentials different from ground potential;
extracting charged particles from the plasma chamber;
focusing the charged particles into a beam and directing the beam onto or near the workpiece outside of the plasma chamber; and
further comprising providing a biasing electrode in contact with the conductive shield in which the biasing electrode biases the conductive shield potential to a potential of greater than 1000 V.

2. The method of claim 1 further comprising providing a cooling fluid to cool the plasma chamber.

3. The method of claim 1 in which providing a conductive shield includes providing a conductive shield coated onto the interior wall of the plasma chamber.

4. The method of claim 1 in which providing a conductive shield includes providing a conductive material inserted into the interior of the plasma chamber.

5. The method of claim 1 in which maintaining the plasma and the conductive shield at electrical potentials different from ground potential includes maintaining the plasma at a high voltage.

6. The method of claim 1 in which the conductive shield is not liquid cooled.

7. The method of claim 1 in which there is no metal sputter target for physical vapor deposition in the plasma chamber.

8. The method of claim 1 in which providing radio frequency energy to maintain a plasma in the plasma chamber includes maintaining a plasma lacking metal ions.

9. The method of claim 1 in which the plasma is biased to a potential to produce a landing energy of the charged particles of between 500 eV and 100 keV.

10. The method of claim 1 in which the conductive shield is a split Faraday shield.

11. The method of claim 10 in which the split Faraday shield is wrapped around the interior of the plasma chamber to form a cylindrical shape within the plasma chamber.

12. The method of claim 1 in which the plasma temperature is kept low enough to avoid sputtering of the conductive shield within the plasma chamber.

13. The method of claim 1 in which the conductive shield distributes heat from the plasma to the walls of the plasma chamber.

14. The method of claim 1 in which the energy spread of the ions leaving the plasma chamber is less than 6 eV.

15. The method of claim 1 in which maintaining the plasma and the conductive shield at electrical potentials different from ground potential includes providing a single electrical connection to bias both the conductive shield and an extraction aperture.

16. The method of claim 1 in which providing a conductive shield comprises providing a thin conductive foil inserted within the plasma chamber.

17. A method of operating a plasma source for a focused beam system, the plasma source including a plasma chamber comprising:
providing radio frequency energy into the plasma chamber from at least one conductive coil to maintain a plasma in the plasma chamber;
providing a conductive shield positioned within the plasma chamber such that no portion of the conductive shield extends into a second chamber containing a workpiece to reduce capacitive coupling between the source of the radio frequency and the plasma;
maintaining the plasma and the conductive shield at electrical potentials different from ground potential;
extracting charged particles from the plasma chamber;
focusing the charged particles into a beam and directing the beam onto or near the workpiece outside of the plasma chamber; and
further comprising providing a biasing electrode in contact with the conductive shield in which the biasing electrode maintains the conductive shield at a voltage having a magnitude greater than 1000 V.

* * * * *